United States Patent [19]
Yonce

[11] 3,944,915
[45] Mar. 16, 1976

[54] TEST CONNECTOR WITH ELECTRICALLY CONDUCTIVE HOOK FOR TESTING ELECTRICAL CIRCUITS OF HIGHWAY VEHICLES

[76] Inventor: Everett R. Yonce, 464 42nd St., Oakland, Calif. 94609

[22] Filed: Sept. 11, 1974

[21] Appl. No.: 505,168

Related U.S. Application Data

[63] Continuation-in-part of Ser. No. 349,261, April 9, 1973, which is a continuation of Ser. No. 192,445, Oct. 26, 1971.

[52] U.S. Cl. ............... 324/51; 339/14 P; 339/113 L
[51] Int. Cl.² ..................... G01R 31/02; H01R 3/06
[58] Field of Search .......... 324/51, 53, 54, 66, 72.5, 324/133; 339/14 R, 14 P, 113 L, 151 B, 157 C; 340/252

[56] References Cited
UNITED STATES PATENTS

| | | | |
|---|---|---|---|
| 1,735,295 | 11/1929 | Olley | 339/14 L |
| 2,195,975 | 4/1940 | Ribble et al. | 324/51 X |
| 2,229,927 | 1/1941 | Kamper | 324/51 |
| 2,717,988 | 9/1955 | Myers | 324/51 UX |
| 2,851,659 | 9/1958 | Ladrick | 324/51 X |
| 3,383,588 | 5/1968 | Stoll et al. | 324/51 |
| 3,428,888 | 2/1969 | Nolte | 324/51 |
| 3,571,701 | 3/1971 | Lai | 324/51 |

*Primary Examiner*—Gerard R. Strecker
*Attorney, Agent, or Firm*—Theodore J. Bielen, Jr.; Richard Esty Peterson

[57] ABSTRACT

A test connector for checking electrical circuits of a vehicle or the like, such as the circuits between a truck and a towed trailer or between two sections of a semitrailer highway vehicle, including an elongated dielectric body enclosing a plurality of indicator lamps visible through lenses on an indicator panel having indicia thereon identifying the particular circuits. Male or female contacts from the vehicle may be plugged into a mating electrical connector for coupling each of the lamps into a corresponding electrical circuit to be tested. An electrically conductive hook extends from the body to provide a means for supporting the connector to the vehicle and an electrical ground connection between the test connector and the vehicle.

6 Claims, 4 Drawing Figures

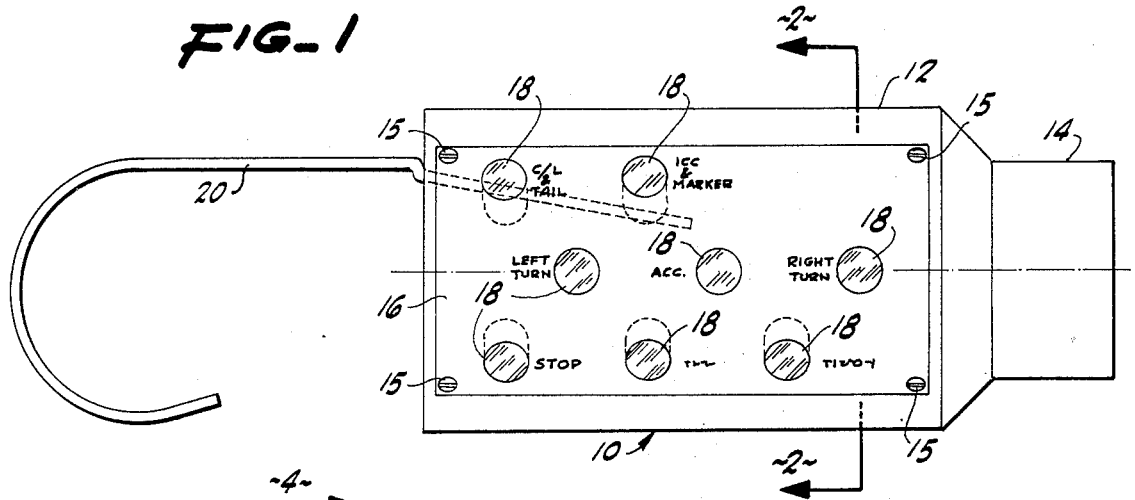
FIG.-1
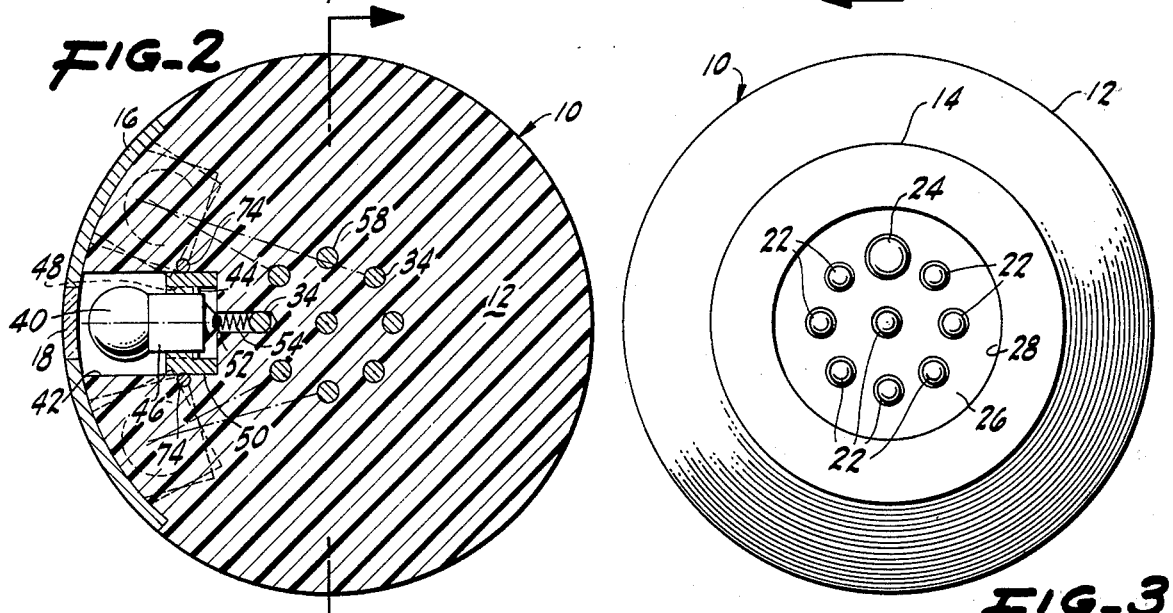
FIG.-2
FIG.-3
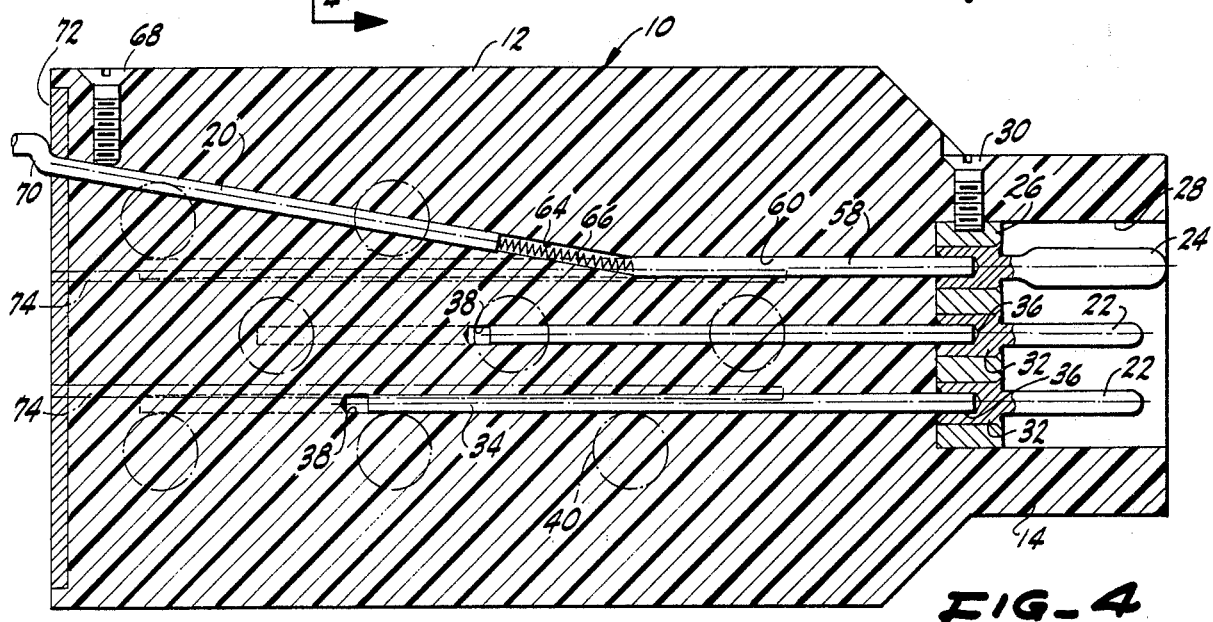
FIG.-4

TEST CONNECTOR WITH ELECTRICALLY CONDUCTIVE HOOK FOR TESTING ELECTRICAL CIRCUITS OF HIGHWAY VEHICLES

CROSS-REFERENCE TO RELATED APPLICATIONS

This is a continuation-in-part of application Ser. No. 349,261, filed Apr. 9, 1973, which is a continuation of application Ser. No. 192,445, filed Oct. 26, 1971.

BACKGROUND OF THE INVENTION

This invention relates to electrical circuits extending between a tractor or truck and a towed unit or trailer of a highway semitrailer or truck-trailer combination, the internal circuits of an airplane on the ground, and the like. In particular, this invention provides a test connector which may be used for checking those electrical circuits.

For example, highway vehicles are required to have "running" lights and "taillights" for showing the presence of the vehicles to drivers and other vehicles which may approach or overtake the vehicles on a roadway during hours of darkness. Vehicles must have further lights for signaling, such that other drivers may know when brakes are being applied and when a left or right turn is intended. These lights operate from electrical circuits which extend from switches in the cab or driver's compartment to various locations on the sides and the rear of the vehicle. When a trailer is towed by another vehicle, the electrical circuits must pass through a flexible electrical cable which spans the towing vehicle and the trailer. In semitrailer combination vehicles, an electrical cable must extend between the tractor unit and the trailer unit of the combination vehicle. Electrical plug connectors are provided such that the cable may be conveniently disconnected when the vehicles are unhitched from each other, or when the tractor unit is separated from the trailer unit of a semitrailer combination vehicle.

In the interest of highway safety, the various electrical circuits of a truck-trailer combination vehicle must be frequently checked. Obviously, a simple check of the overall circuits would be to plug the connectors together and to test the circuits through the truck-trailer combination as a whole. A driver could operate the brakes, could turn on the various light switches, and could operate the turn signal control lever while another person standing behind and apart from the vehicle could observe the various lights. If a malfunctioning of one or more of the circuits is detected, a trouble shooter must determine the cause, and it then becomes important to establish whether the trouble is in the switches, wiring of the truck, or in the lamps or wiring of the trailer. Under these conditions, it has been found to be most expedient to unplug the connector to electrically separate the truck from the trailer such that the circuits of each unit can be separately checked. Indeed, it is frequently necessary to check the electrical circuits in one unit, such as the tractor or truck unit, without the presence of another companion unit.

It is an object of this invention to provide an improved means for checking electrical circuits common to a truck or tractor unit and a trailer unit of a semitrailer combination vehicle. More particularly, it is an object of this invention to provide a pluggable test connector which will mate and plug into a connector of the vehicle unit for providing a visual indication of the functioning or malfunctioning of the electrical circuits.

It is a further object of this invention to provide an improved test connector for checking electrical circuits of a truck-trailer combination vehicle wherein said connector may be hooked onto and supported by a part of the vehicle. More specifically, it is an object of this invention to provide an electrically conductive hook arrangement for both supporting the test connector and for electrically grounding the test connector such that electric currents may pass through the indicator lamps which will provide visual indications of the functioning of the electrical circuits.

SUMMARY OF THE INVENTION

Accordingly, the test connector includes a dielectric, cylindrical body in which the electrical components are arranged. Electric prongs in a predetermined configuration are supported by a transverse dielectric bulkhead and extend from a core in one of the ends of the cylindrical body. Indicator lamps or bulbs in a preselect configuration are supported in cavities in the connector body and are visible through lenses in an indicator panel on the exterior of the body. Spiral springs are compressed against bottom contacts of the indicator lamps and against conductors attached to the prongs to provide paths for electric currents between the prongs and the corresponding indicator lamps. An electrically conductive hook extends from the cylindrical body to provide both mechanical support for and an electrical ground connection to the test connector. Each of the indicator lamps connects to ground through appropriate conductors and the hook support to a vehicle part.

BRIEF DESCRIPTION OF THE DRAWINGS

FIG. 1 is a side elevational view of the test connector.

FIG. 2 is a cross-sectional view taken on the lines 2—2 in FIG. 1.

FIG. 3 is an end view of the test connector of FIG. 1.

FIG. 4 is a cross-sectional view taken on the lines 4—4 in FIG. 2.

DETAILED DESCRIPTION OF THE PREFERRED EMBODIMENT

Referring to FIG. 1, the test connector, designated generally by the reference numeral 10, is shown having an elongated, cylindrical and electrically non-conductive body 12. The cylindrical body 12 has a concentrically reduced connector end 14 which is connectable to a conventional, compatible connector (not shown) mounted, for example, at the end of a flexible cable on the tractor portion of a tractor and trailer rig, as described in U.S. Pat. No. 3,836,843, issued Sept. 17, 1974, entitled "ELECTRICAL CIRCUIT TESTER CONNECTOR FOR HIGHWAY VEHICLES".

On the side of the cylindrical body 12, secured by four screws 15, is an indicator panel 16 with a plurality of transparent light lenses 18 arranged in a spaced array on the indicator panel 16. As illustrated in FIG. 2, the indicator panel 16 and lenses 18 are recessed in the cylindrical body 12 to provide a flush surface to the connector 10.

When the test connector is used for testing tractor circuits which are associated with a trailer where the trailer is detached, the indicator panel preferably includes the appropriate legends associated with particular circuits, such as the exemplar legends illustrated in FIG. 1. The light lenses 18 are preferably colored for coded identification and, in the preferred embodiment of the connector 10, the lenses conform to ICC color codes to provide an easy, visual identification of particular referenced circuits. While any greater or lesser number of lenses may be provided, as necessary, for the use intended, eight lenses have been here selected to permit a convenient arrangement of the cooperating components.

At the other end of the connector opposite the reduced connector end is an extension hook 20, which is of an electrically conductive material such as steel. The extension hook 20 provides a convenient electrical ground path for the connector to any convenient ground element in the area of use. The hook 20, in addition, concurrently provides a convenient support for holding the test connector in a position where the light lenses may be observed.

Referring now to the remaining figures, the construction of the test connector is shown in greater detail. In FIGS. 3 and 4, a symmetrical arrangement of electric prongs 22 and 24 are mounted on a transverse, dielectric bulkhead 26 within a concentric core 28 in the reduced connector end 14. The prongs 22 and 24 provide electrical terminals for the connector 10 for connecting to a compatible female connector of an associated cable (not shown). Where required, the connector end may include electrical terminals of a female-socket type for compatible connection to male prongs of an associated connector.

The enlarged terminal prong 24 provides a means of properly orienting the test connector such that appropriate circuits are correctly connected. A screw 30, threaded through the wall of the reduced end 14 of the connector and into the side of the dielectric bulkhead 26, locks the bulkhead 26 and supported prongs 22 and 24 within the core 28.

The prongs 22 have base ends 32 embedded in the dielectric bulkhead 26 which engage rod-like conductors 34. The rod-like conductors 34 are inserted in holes 36 formed in the base ends of the prongs 22 and extend longitudinally into holes 38, drilled or otherwise formed, within the dielectric body 12 of the test connector 10, as shown in FIG. 4.

Behind the arrangement of lenses 18, shown in FIG. 1, is a corresponding arrangement of cylindrical cavities, drilled or otherwise formed, in the cylindrical body 12 of the test connector. Seated in each cavity is an indicator lamp that is electrically connected to a corresponding prong. For example, referring to the cross-sectional view of FIG. 2, a conventional lamp bulb 40 is seated within a cavity 42 in the cylindrical body 12 of the connector 10. The lamp bulb has a conventional first terminal having a bayonet-type holding means with projections 44 on an annular contact surface 46 insertable through slots 48 (shown in dotted line) in a socket 50 in the base of the cavity 42. The bulbs are retained by altering the alignment of the projections 44 and the slots 48 by a partial twist of the bulb. The socket 50 provides a ground connection for the annular contact surface 46 or first terminal of the bulb.

At the end of the lamp bulb 40 is contact element 52, or second terminal, which is electrically connected to a cooperating rod-like conductor 34 by a small, spiral spring 54 contained in a hole 56 drilled or formed from the cavity 42 to the appropriate hole for a corresponding rod-like conductor. The spring 54 is attached to the conductor 34 by soldering and is compressed against the contact element 52 at the bottom of the bulb 40, holding the bulb in position and providing a path for electrical current between the rod-like conductor 34 and the bulb 40.

As shown in FIG. 4, the holes 36 for the rod-like conductors 34 are of staggered length and terminate transversely opposite selected lamp bulbs. The cavities and connecting holes for the electrically conducting spiral springs are formed on a coincident axis which directly connects the cavities and staggers conductor holes, as schematically illustrated in dotted line in FIGS. 2 and 4. In this manner, each light bulb is electrically connected to an individual and select prong 22.

In a somewhat similar manner, the enlarged terminal prong 24 has a rod-like conductor 58 inserted in a hole 60, formed or otherwise drilled in the body of the connector, and connected to the base end 62 of the prong. The hole 60 for the conductor communicates with an intersecting hole 64 into which the end of the electrically conductive hook 20 is inserted. A spiral compression spring 66 electrically connects the end of the rod-like conductor 58 with the inserted end of the hook 20. The hook 20 is retained in position by a machine screw which is threaded in the side of the test connector in engagement with the inserted portion of the hook 20.

The electrically conductive hook 20 has a crook 70 that is seated on an electrically conductive end plate 72 mounted flush across the end of the test connector.

Referring to FIG. 2, two small rod-like conductors 74 extend from the end plate 72 longitudinally into the cylinder body 12 (as shown in phantom in FIG. 4) contacting each of the sockets 50 for the lamp bulbs 40. The end plate 72, in this manner, provides a common ground connection for the lamp sockets 50, the hook 20, and the enlarged prong 24.

By an electrical path through the prongs 22, the rod-like conductors 34, the springs 54 to the light bulb 40, and, from the bulb 40 through the socket and conductors 74 to the end plate 72, a prong ground hook 20 is thereby created.

The test connector of this invention enjoys the advantage of permitting a single person, such as a truck driver, to test the electrical circuits connecting between two separable units of a highway combination vehicle. The test connector may be plugged into the electrical circuits and, by means of the hook 20, the connector is grounded and is held in a position for the driver to visually observe the indicator lamps as he tests the various electrical circuits. No second person is necessary to make observations as to the proper functioning of the circuits.

The test connector of this invention is small and portable and can have a prong configuration that is standardized with all of the plug connectors of a fleet of trucks and other vehicles. Therefore, a single test connector can be used to check out the electrical circuits for many vehicles. Although this test connector can be used for checking the electrical circuits of a conventional semitrailer combination vehicle, it will be appreciated that this invention can also be applied to any combination of highway vehicles wherein one vehicle tows another and certain electrical circuits must extend between the towing vehicle and the towed vehicle. Nor is this test connector limited to its preferred use with trucks. It may be used to test socket-coupled circuits in airplanes where 100 to 150 circuits must be tested before each flight.

As previously indicated, the lights 40 have a predetermined orientation in which the positions of the lenses 18 respectively correspond to select prongs 22 so that one observing the lights will be able to determine which circuits are functioning properly. Legends or other indicia, such as lens color, may be included on the indicator panel 16 to supply specific information as to the circuits with which the lights are respectively associated. Ordinarily, an associated cable is sufficiently long that the test connector 10 can be hung from a door handle so that one seated within the tractor can readily observe the condition of the lenses 18. Further, the large prong 24 is generally a ground connection and the condition of the ground circuit can be tested by insulating the hook 20 from the chassis of the tractor.

This latter feature is of considerable practical importance because it is quite common to find the ground connection to the tractor chassis through an associated cable to be cut or broken, thereby resulting in the only ground circuit from a trailer to be effected through the fifth-wheel, or hitch, of the tractor. Such connection is generally quite good when the vehicle is stationary at a test station but it is intermittent when the vehicle is in motion because of the relative displacements between a tractor and trailer that occur at the fifth-wheel connection therebetween as a consequence of road bumps, etc.

The test connector is small, compact, lightweight, handy (it can be carried in a coat or pants pocket), and convenient to use. It permits repair work on a tractor when the trailer is not available. The number of indicator lenses 18 and prongs 22 can be increased or decreased, as necessary, for any particular embodiment of the test connector and the test lenses and prongs may be oriented in a standard or universal configuration so that the device can be used with various tractor-trailer rigs. An appropriate indicator panel with specific legends for a particular tested system may be arranged on the side of a cylindrical connector body, as shown, but may be adapted to the end of a connector body of the type described in the patent referenced above.

While in the foregoing specification an embodiment of the invention has been set forth in considerable detail for purposes of making a complete disclosure thereof, it will be apparent to those skilled in the art that numerous changes may be made in such details without departing from the spirit and principles of the invention.

What is claimed is:

1. A test connector for testing electrical circuits of highway tractor and trailer vehicles, comprising:
   a. an elongated body;
   b. a transverse bulkhead extending across said body and being electrically non-conductive;
   c. a plurality of contacts mounted in said transverse bulkhead for making electrical connection with the electrical circuits;
   d. a plurality of electrical lamps, each provided with a first and second terminal and being supported by said body such that illumination of each lamp provides visual indications of voltage being applied to an associated electrical circuit;
   e. means for electrically connecting each of said first terminals of said electric lamps with each of said corresponding contacts;
   f. an electrically conductive hook;
   g. means for electrically connecting said hook to each of said second terminals of said electric lamps; and
   h. an indicator panel transmitting the illumination of each lamp to the exterior of said elongated body and positioned in overlying relation to said lamps, said hook connected with said body, having a portion thereof extending from said body for supporting said test connector, and making an electrical ground connection between each of said electric lamps and one of said vehicles such that a plurality of complete test connector circuits connecting such electrical circuits of a vehicle to the ground can be provided through said contacts, said means electrically connecting said lamps with said corresponding contacts, said electric lamps, said means electrically connecting said hook and said electric lamps, and said hook.

2. The test connector of claim 1 in which said means for electrically connecting said hook to each of said second terminals of said electric lamps comprises an electrically conductive end plate on said body and conductor means interconnecting said second terminals and said end plate.

3. The test connector of claim 2 in which said body is electrically non-conductive and said body has a plurality of cavities therein respectively receiving said electric lamps.

4. The test connector of claim 1 in which said means for electrically connecting each of said first terminals of said electric lamps with each of said corresponding contacts comprises a plurality of springs respectively connected with a plurality of rod-like conductors connected to said contacts, each spring extending to and compressed against a first terminal of the associated lamp and a conductor to pass current between the contact and lamp.

5. The test connector of claim 1 in which said indicator panel includes indicia identifying the illumination of each lamp as associated with a particular circuit.

6. The test connector of claim 1 in which said indicator panel is positioned along the axis of said elongated body.

* * * * *